(12) United States Patent
Paton et al.

(10) Patent No.: US 6,921,709 B1
(45) Date of Patent: Jul. 26, 2005

(54) FRONT SIDE SEAL TO PREVENT GERMANIUM OUTGASSING

(75) Inventors: Eric N. Paton, Morgan Hill, CA (US); Haihong Wang, Fremont, CA (US); Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/620,194

(22) Filed: Jul. 15, 2003

(51) Int. Cl.[7] ............................. H01L 21/336
(52) U.S. Cl. ............. 438/517; 438/522; 438/530; 438/660; 438/663; 438/680; 438/685; 438/761; 438/763; 438/785; 438/787; 438/791; 438/923; 438/933
(58) Field of Search ............................... 438/517, 522, 438/530, 660, 663, 680, 685, 761, 763, 785, 438/787, 791, 923, 933, FOR 134, FOR 187, 438/FOR 188, FOR 291, FOR 398, FOR 424

(56) References Cited

U.S. PATENT DOCUMENTS

| | | | |
|---|---|---|---|
| 5,254,873 A | 10/1993 | Poon et al. | |
| 5,266,813 A | 11/1993 | Comfort et al. | |
| 5,406,111 A | 4/1995 | Sun | |
| 5,455,194 A | 10/1995 | Vasquez et al. | |
| 5,668,044 A | 9/1997 | Ohno | |
| 5,700,712 A | 12/1997 | Schwalke | |
| 5,719,085 A | 2/1998 | Moon et al. | |
| 5,793,090 A * | 8/1998 | Gardner et al. | 257/408 |
| 5,837,612 A | 11/1998 | Ajuria et al. | |
| 6,013,937 A | 1/2000 | Beintner et al. | |
| 6,037,238 A | 3/2000 | Chang et al. | |
| 6,074,930 A | 6/2000 | Cho et al. | |
| 6,074,931 A | 6/2000 | Chang et al. | |
| 6,080,618 A | 6/2000 | Bergner et al. | |
| 6,080,627 A | 6/2000 | Fan et al. | |
| 6,080,637 A | 6/2000 | Huang et al. | |
| 6,087,705 A | 7/2000 | Gardner et al. | |
| 6,107,143 A | 8/2000 | Park et al. | |
| 6,136,664 A | 10/2000 | Economikos et al. | |
| 6,146,970 A | 11/2000 | Witek et al. | |
| 6,150,212 A | 11/2000 | Divakaruni et al. | |
| 6,168,961 B1 | 1/2001 | Vaccari | |
| 6,207,531 B1 | 3/2001 | Pen-Liang | |

(Continued)

FOREIGN PATENT DOCUMENTS

EP      0 245 622 B1     11/1987

(Continued)

OTHER PUBLICATIONS

Written Opinion of the International Searching Authority: International Application No. PCT/US2004/007464; International Filing Date Mar. 11, 2004; 6 pgs.

(Continued)

Primary Examiner—George Fourson
Assistant Examiner—Joannie Adelle García
(74) Attorney, Agent, or Firm—Foley & Lardner LLP

(57) ABSTRACT

A method of manufacturing an integrated circuit having a gate structure above a substrate that includes germanium utilizes at least one layer as a seal. The layer advantageously can prevent back sputtering and outdiffusion. A transistor can be formed in the substrate by doping through the layer. Another layer can be provided below the first layer. Layers of silicon dioxide, silicon carbide, silicon nitride, titanium, titanium nitride, titanium/titanium nitride, tantalum nitride, and silicon carbide can be used.

20 Claims, 3 Drawing Sheets

U.S. PATENT DOCUMENTS

| | | | |
|---|---|---|---|
| 6,214,696 | B1 | 4/2001 | Wu |
| 6,271,143 | B1 | 8/2001 | Mendicino |
| 6,306,722 | B1 * | 10/2001 | Yang et al. ............... 438/424 |
| 6,391,731 | B1 * | 5/2002 | Chong et al. .............. 438/303 |
| 6,399,512 | B1 | 6/2002 | Blosse et al. |
| 6,414,364 | B2 | 7/2002 | Lane et al. |
| 6,426,278 | B1 * | 7/2002 | Nowak et al. ............. 438/528 |
| 6,456,370 | B1 | 9/2002 | Ingles, Jr. |
| 6,468,853 | B1 | 10/2002 | Balasubramanian et al. |
| 6,498,383 | B2 | 12/2002 | Beyer et al. |
| 6,524,931 | B1 | 2/2003 | Perera |
| 6,548,361 | B1 * | 4/2003 | En et al. ..................... 438/301 |
| 6,566,228 | B1 | 5/2003 | Beintner et al. |
| 6,613,646 | B1 | 9/2003 | Sahota et al. |
| 6,646,322 | B2 | 11/2003 | Fitzgerald |
| 6,656,749 | B1 * | 12/2003 | Paton et al. ................... 438/5 |
| 6,673,696 | B1 | 1/2004 | Arasnia et al. |
| 2002/0045312 | A1 * | 4/2002 | Zheng et al. ............... 438/253 |
| 2002/0098689 | A1 * | 7/2002 | Chong et al. ............... 438/655 |
| 2003/0049893 | A1 | 3/2003 | Currie et al. |
| 2003/0139051 | A1 | 7/2003 | Andideh et al. |
| 2004/0061161 | A1 | 4/2004 | Radens et al. |
| 2004/0089914 | A1 | 5/2004 | Moull et al. |

FOREIGN PATENT DOCUMENTS

| | | |
|---|---|---|
| GB | 2 254 731 A | 10/1992 |
| WO | WO02/095818 A1 | 11/2002 |
| WO | WO02/101818 A2 | 12/2002 |

OTHER PUBLICATIONS

International Search Report; International Application No. PCT/US2004/007464; mailed Jan. 9, 2004; 3 pgs.

Ohkubo, Satoshi; Tamura Yasuyuki; Sugino, Rinji; Nakanishi, Toshiro; Sugita, Yoshihiro; Awaji, Naoki and Takasaki, Kanetake; "High Quality Ultra-Thin (4nm) Gate Oxide by $UV/O_3$ Surface Pre-Treatment of Native Oxide"; 1995 Symposium On VLSI Technology; Digest of Technical Papers; Jun. 6-8, 1995; Kyoto, Japan; 3 pgs.

Written Opinion of the International Searching Authority; International Application No. PCT/US2004/000982; International Filing Date Jan. 13, 2004; 6 pgs.

International Search Report for PCT/US2004/000982, 4 pages.

Wolf, Stanley, Ph.D. and Tauber, Richard N., Ph.D.; "Silicon Processing For The VLSI Era"; vol. 1: Process Technology; Lattice Press; 1986; pp. 57-58, 194.

Ghandhi, Sorab K. "VLSI Fabrication Principles"; John Wiley and Sons; 1983; pp. 422-423.

Van Zant, Peter, "Microchip Fabrication", McGraw Hill, 1977, pp. 31 and 39.

Vossen, John L. and Kern, Werner, Thin Film Processes II, Academic Press, 1991, p. 333.

Rim, K., Welser, J., Hoyt, J.L., and Gibbons, J.F., "Enhanced Hole Mobilities in Surface-channel Strained-Si p-MOSFETs", 1995 International Electron Devices Meeting Technical Digest, 5 pages.

Welser, J., Hoyt, J.L., Takagi, S. and Gibbons, J.F., "Strain Dependence of the Performance Enhancement in Strained-Si n-MOSFETs", 1994 International Electron Devices Meeting Technical Digest, San Francisco, CA Dec. 11-14, 1994, 5 pages.

* cited by examiner

US 6,921,709 B1

FRONT SIDE SEAL TO PREVENT GERMANIUM OUTGASSING

CROSS-REFERENCE TO RELATED PATENT APPLICATIONS

The present application is related to U.S. application Ser. No. 10/341,863, filed on Jan. 14, 2003 by Ngo et al., entitled "Shallow Trench Isolation For Strained Silicon Process" and assigned to the Assignee of the present application.

FIELD OF THE INVENTION

The present invention relates generally to integrated circuit (IC) fabrication. More particularly, the present invention relates to a design for and a method of reducing contamination during IC fabrication on substrates and layers containing germanium.

BACKGROUND OF THE INVENTION

Strained silicon (SMOS) processes are utilized to increase transistor (MOSFET) performance by increasing the carrier mobility of silicon, thereby reducing resistance and power consumption and increasing drive current, frequency response and operating speed. Strained silicon is typically formed by growing a layer of silicon on a silicon germanium substrate or layer. Germanium can also be implanted, deposited, or otherwise provided to silicon layers to change the lattice structure of the silicon and increase carrier mobility.

The silicon germanium lattice associated with the germanium substrate is generally more widely spaced than a pure silicon lattice, with spacing becoming wider with a higher percentage of germanium. Because the silicon lattice aligns with the larger silicon germanium lattice, a tensile strain is created in the silicon layer. The silicon atoms are essentially pulled apart from one another. Relaxed silicon has a conductive band that contains six equal valance bands. The application of tensile strength to the silicon causes four of the valance bands to increase in energy and two of the valance bands to decrease in energy. As a result of quantum effects, electrons effectively weigh 30 percent less when passing through the lower energy bands. Thus, lower energy bands offer less resistance to electron flow.

In addition, electrons meet with less vibrational energy from the nucleus of the silicon atom, which causes them to scatter at a rate of 500 to 1,000 times less than in relaxed silicon. As a result, carrier mobility is dramatically increased in strained silicon compared to relaxes silicon, providing an increase in mobility of 80 percent or more for electrons and 20 percent or more for holes. The increase in mobility has been found to persist for current fields up to 1.5 megavolt/centimeter. These factors are believed to enable device speed increase of 35 percent without further reduction of device size, or a 25 percent reduction in power consumption without reduction in performance.

The use of germanium in SMOS processes can cause germanium contamination problems for IC structures, layers, and equipment. In one example, germanium outgassing or outdiffusion can contaminate various components associated with the fabrication equipment and integrated circuit structures associating with the processed wafer. Further, germanium outgassing can negatively impact the formation of thin films. In addition, germanium outdiffusion can cause germanium accumulation or "pile-up" at the interface of the liner, thereby causing reliability issues for the STI structure. In another example, germanium resputtering can cause contamination. Germanium resputtering can occur when the IC substrate is subjected to implants, cleaning and doping steps. For example, providing dopants for the source and drain regions can cause germanium resputtering.

Thus, there is a need for an SMOS process which reduces germanium contamination. Further, there is a need for a process of forming source and drain regions that does not promote germanium contamination. Further still, there is a need for an SMOS process which reduces germanium resputtering. Yet further, there is a need for a process and structure that reduces germanium outgassing. Even further, there is a need for a method of siliciding and a transistor architecture which avoids germanium resputtering.

SUMMARY OF THE INVENTION

An exemplary embodiment relates to a method of manufacturing an integrated circuit. The integrated circuit includes a gate structure above a substrate that includes germanium. The method includes forming a first layer above the gate structure and above the substrate, forming a second layer above the first layer, and doping source and drain regions through the first layer and the second layer. Germanium back sputtering is reduced by the method.

Yet another exemplary embodiment relates to a method of forming source and drain regions in a strained semiconductor layer. The method includes providing a first layer comprising at least one of silicon nitride and silicon dioxide above the strained semiconductor layer, providing a second layer above the first layer, and implanting non-neutral dopants into the strained semiconductor layer. The second layer contains nitrogen, titanium, tantalum or carbon. The method also includes annealing the strained semiconductor layer.

Still another exemplary embodiment relates to a method of fabricating a transistor in a germanium containing layer. The method includes providing a gate structure above the germanium containing layer, providing a first layer of insulative material in a low temperature process above the germanium containing layer, doping to form source and drain regions, and annealing to activate dopants in the source and drain regions.

BRIEF DESCRIPTION OF THE DRAWINGS

Exemplary embodiments will hereafter be described with reference to the accompanying drawings, wherein like numerals denote like elements.

DETAILED DESCRIPTION OF THE PREFERRED EMBODIMENTS

FIGS. 1 through 7 illustrate a method of manufacturing an integrated circuit (IC) in accordance with an exemplary embodiment. The method and IC structure illustrated in FIGS. 1 through 7 reduces the germanium contamination during various fabrication processes, including doping. The process includes at least one sealing layer that reduces germanium outdiffusion and back sputtering and can be used as a part of any process that seeks to avoid germanium contamination. Advantageously, the process reduces germanium contamination of fabrication equipment and IC structures associated with silicon germanium substrates and strained silicon or semiconductor layers.

Referring to FIGS. 2 through 7, a cross-sectional view of a portion 12 of an integrated circuit (IC) is illustrated. Portion 12 (FIG. 2) is subjected to process 100 (FIG. 1) to form an IC. The IC can include a transistor with a gate structure and a source and drain region as explained below. Germanium contamination can be reduced through an advantageous process and transistor architecture. The architecture uses at least one sealing layer to prevent germanium from adversely affecting the formation of IC devices.

Figure 1:
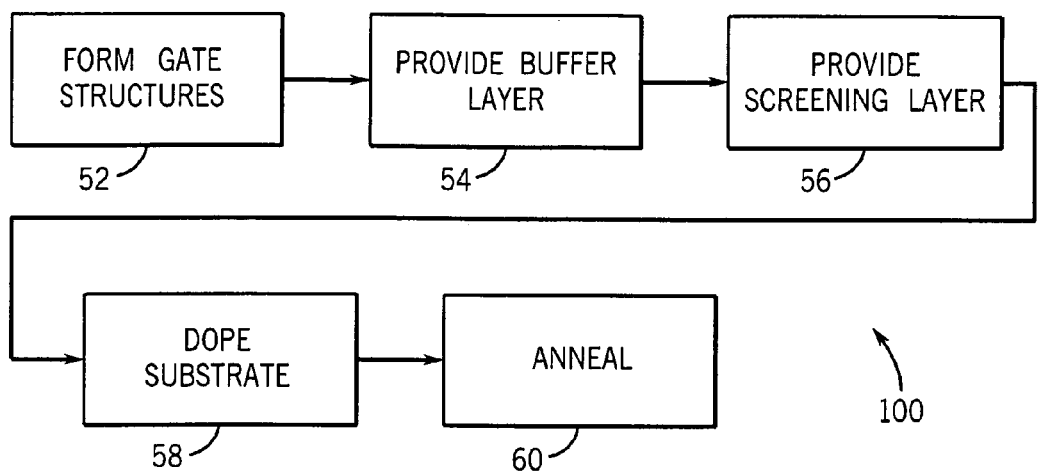
FIG. 1 is a flow diagram showing a fabrication process for a germanium-containing IC substrate in accordance with an exemplary embodiment.
Figure 2:
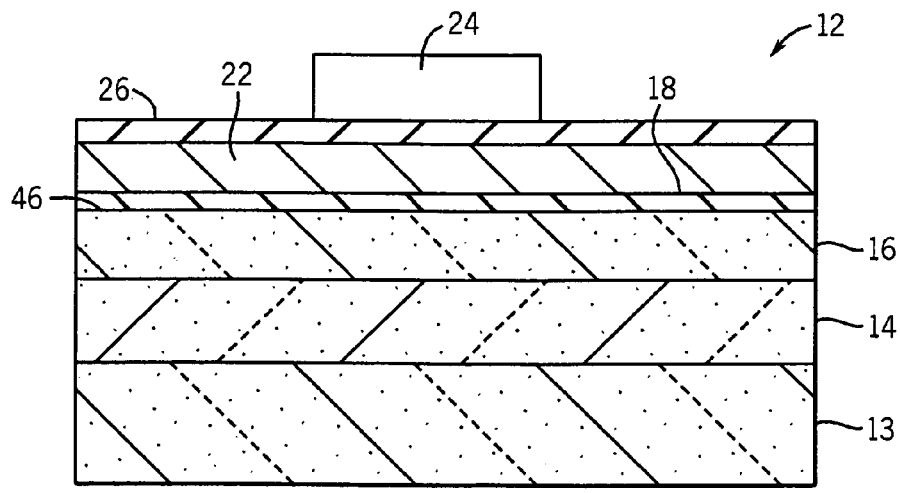
FIG. 2 is a cross-sectional view schematic drawing of a portion of the IC substrate used in the process illustrated in FIG. 1, the IC substrate including a lithographic feature above a gate stack above a strained silicon layer above a silicon germanium substrate.

In FIG. 2, portion 12 includes a strained silicon layer 16 provided over a semiconductor substrate 14 or a germanium containing layer or substrate. Substrate 14 can be provided above a substrate 13.

Substrate 13 is optional and portion 12 can be provided with substrate 14 as the bottom-most layer. Substrate 13 can be the same material or a different material than substrate 14. In one embodiment, substrate 13 is a semiconductor substrate such as a silicon substrate upon which silicon germanium substrate 14 has been grown. In another embodiment, substrates 13 and 14 are not included and the substrate is comprised of layer 16. In such an embodiment, layer 16 can be a silicon germanium substrate or a strained silicon substrate.

Portion 12 can be any type of semiconductor device, or portion thereof, made from any of the various semiconductor processes such as a complementary metal oxide semiconductor (CMOS) process, a bipolar process, or another semiconductor process. Portion 12 may be an entire IC or a portion of an IC including a multitude of electronic component portions.

Substrate 14 is preferably silicon germanium or another semiconductor material including germanium, and can be doped with P-type dopants or N-type dopants. Substrate 14 can be an epitaxial layer provided on a semiconductor or an insulative base, such as substrate 13. Furthermore, substrate 14 is preferably a composition of silicon germanium ($Si_{1-x}Ge_x$, where X is approximately 0.2 and is more generally in the range of 0.1–0.4). Substrate 14 can be grown or deposited.

In one embodiment, substrate 14 is grown above substrate 13 by chemical vapor deposition (CVD) using disilane ($Si_2H_6$) and germane ($GeH_4$) as source gases with a substrate temperature of approximately 650° C., a disilane partial pressure of approximately 30 mPa and a germane partial pressure of approximately 60 mPa. Growth of silicon germanium material may be initiated using these ratios, or, alternatively, the partial pressure of germanium may be gradually increased beginning from a lower pressure or zero pressure to form a gradient composition. Alternatively, a silicon layer can be doped by ion implantation with germanium, or other processes can be utilized to form substrate 14. Preferably, substrate 14 is grown by epitaxy to a thickness of less than approximately 5000 Å (and preferably between approximately 1500 Å and 4000 Å).

A strained silicon layer 16 is formed above substrate 14 by an epitaxial process. Preferably, layer 16 is grown by CVD at a temperature of 600–800° C. Layer 16 can be a pure silicon layer and may have a thickness of between approximately 50 and 150 Å.

The substrate for portion 12 can be a semiconductor substrate such as silicon, gallium arsenide, germanium, or another substrate material. The substrate can include one or more layers of material and/or features such as lines, interconnects, vias, doped portions, etc., and can further include devices such as transistors, microactuators, microsensors, capacitors, resistors, diodes, etc. The substrate can be an entire IC wafer or part of an IC wafer. The substrate can be part of an integrated circuit such as a memory, a processing unit, an input/output device, etc.

In process 100 (FIG. 1) at step 52, gate structures are formed by providing a gate stack including a gate dielectric layer 18 above a top surface 46 of layer 16, a gate conductor 22, and a bottom anti-reflective (BARC) layer 26. Top surface 46 can be considered a top surface of the substrate or wafer associated with portion 12, even though surface 46 corresponds to the top surface of layer 16 in FIG. 2. In one embodiment, gate structures are formed directly above substrate 14 and layer 16 is not included.

Gate dielectric layer 18 can be a 5–30 Å thick layer of thermally grown silicon dioxide. Alternatively, layer 18 can be deposited. Alternative materials for layer 18 include high-k dielectric layers, medium-k dielectric layers, silicon nitride, and other insulative materials.

Gate conductor 22 is preferably a polysilicon layer having a thickness of 1000–2000 Å and deposited by chemical vapor deposition (CVD). Gate conductor 22 can be deposited as a P-doped or N-doped layer. Alternatively, conductor 22 can be a metal layer such as a refractory metal layer deposited by CVD or sputtering.

Layer 26 is preferably an anti-reflective coating material such as silicon oxynitride (SiON) or silicon nitride ($Si_3N_4$). Alternative materials for layer 26 can also be utilized. Layer 26 serves a dual purpose of providing anti-reflective properties (e.g., as a BARC layer) as well as protecting gate conductor 22 during etching steps. Layer 26 is preferably deposited above gate conductor 22 by chemical vapor deposition (CVD) and has a thickness of between approximately 100 and 300 Å. Alternatively, layer 26 can be thermally grown.

Photoresist feature 24 is formed above layer 26. Preferably, photoresist feature 24 is lithographically patterned to form a gate structure from gate conductor 22 and dielectric layer 18.

Figure 3:
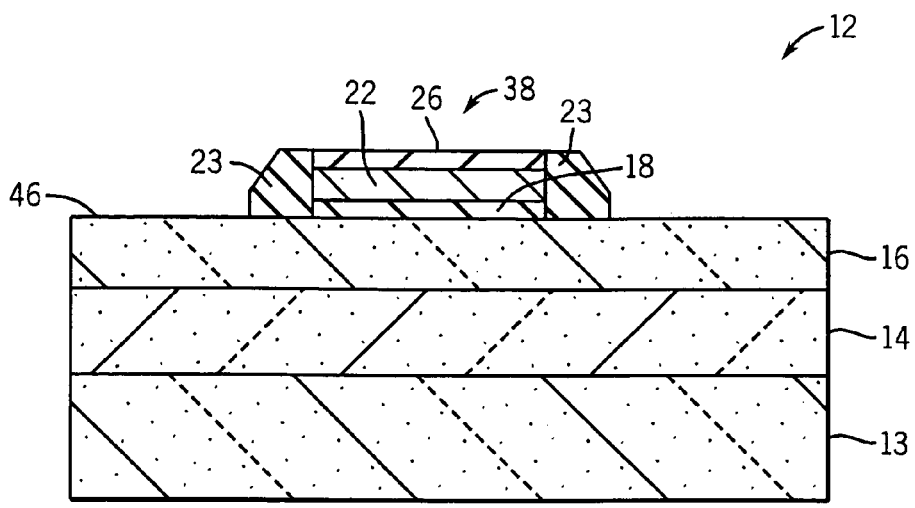
FIG. 3 is a cross-sectional view of the portion illustrated in FIG. 2, showing a gate structure formation step.

In FIG. 3, layers 26 and 18 and gate conductor 22 are etched in a conventional process to leave gate structure 38 (step 52 of process 100). Gate structure 38 can include spacers 23 formed in a deposition and etch back process. In one embodiment, spacers 23 are silicon dioxide, silicon nitride, or another insulating material. In a preferred embodiment, spacers 23 are silicon nitride and layer 26 is stripped before spacers 23 are formed. Substrate 14 and layer 16 can be doped to provide appropriate regions such as halo regions, channel regions, and source and drain regions in step 52.

In one embodiment, spacers 23 are not provided until after the sealing layer is provided. In another embodiment, layer 16 is doped to form shallow source and drain extensions (lightly doped) drains (LDD) before spacers 23 are provided and before the sealing layer is provided.

Figure 4:
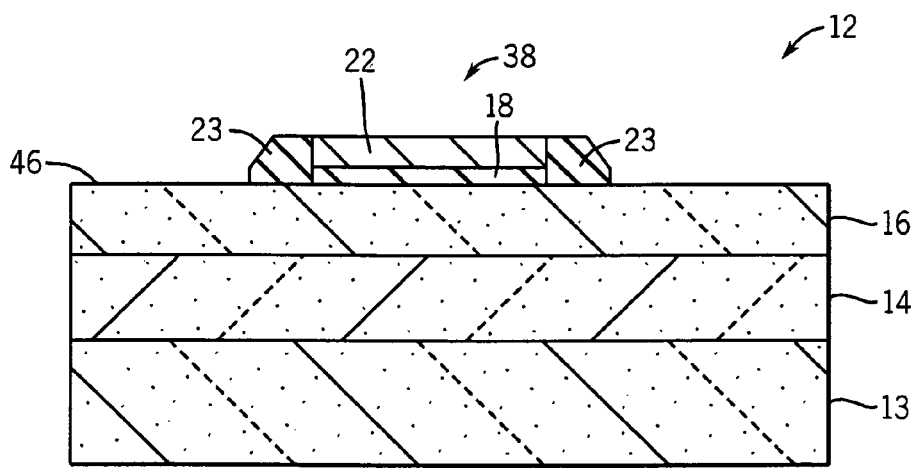
FIG. 4 is a cross-sectional view of the portion illustrated in FIG. 3, showing a coating removal step.

In FIG. 4, in accordance with step 52 of process 100, bottom anti-reflective coating layer (BARC) 26 can be removed from gate conductor 22. BARC layer 26 is preferably removed for appropriate silicidation of gate conductor 22. In one embodiment, portions of spacers 23 are also removed so that a top surface of spacer 23 is planar with a top surface of gate conductor 22. BARC layer 26 can be removed using either a wet etching process with a phosphoric acid bath or by using a dry etching process.

Figure 5:
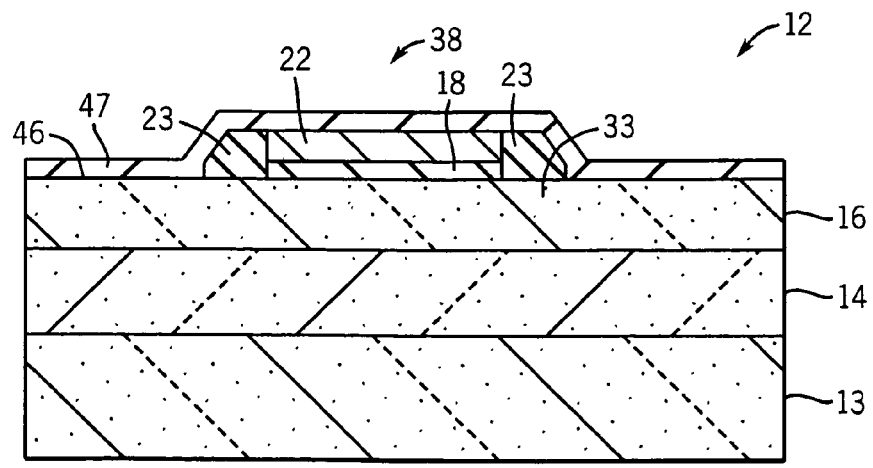
FIG. 5 is a cross-sectional view of the portion illustrated in FIG. 4, showing a buffer layer deposition step.

In FIG. 5, a layer 47 is provided above top surface 46 of layer 16 and gate structure 38. In an embodiment in which gate structure 38 is provided directly above substrate 14, layer 47 is provided above substrate 14 and gate structure 38. Layer 47 can be a buffer layer. Preferably, layer 47 is an insulative material suitable for semiconductor processing materials.

In one example, layer 47 is a 50–400 Å thick layer of silicon dioxide provided above gate structure 38 and silicon nitride spacers 23. Layer 47 can be a 100 Å thick silicon dioxide layer deposited in a tetraethylorthosilicate (TEOS) process. In another embodiment, layer 47 can be a masking material such as silicon nitride ($Si_3N_4$) or siliconoxynitride (SiON). Layer 47 provides an interface between layer 16 and gate structure 38 and the sealing layer discussed below. The sealing layer can prevent germanium outgassing and germanium resputtering following the implantation and annealing process.

Figure 6:
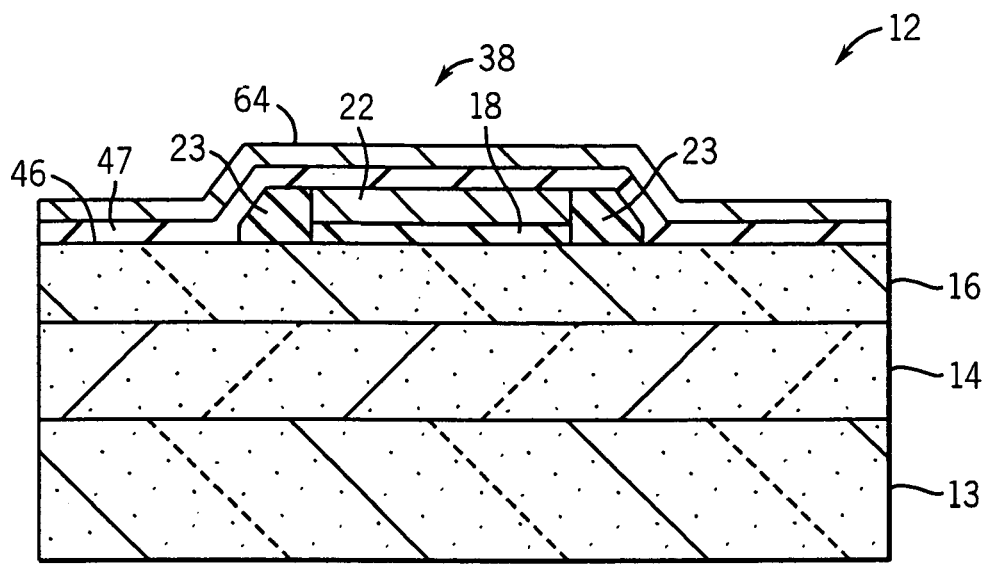
FIG. 6 is a cross-sectional view of the portion illustrated in FIG. 5, showing a sealing layer deposition step.

In FIG. 6, a layer 64 is provided above layer 47. Layer 64 serves as a sealing layer and is provided in accordance with step 56 of process 100. The combination of layers 47 and 64 form a sealing structure to prevent germanium outgassing and germanium resputtering. Layer 47 ensures good seating for layer 64.

In one embodiment, layer 64 is a layer of conductive or semiconductive material having a thickness of between approximately 50 and 200 Å. In one embodiment, layer 64 can be a layer of tantalum nitride (TaN), titanium nitride (TiN), tungsten nitride (WN), titanium/titanium nitride (Ti/TiN). Layer 64 can be deposited by sputtering or by CVD. The materials for layer 64 are chosen for their relatively high temperature stability and etch capabilities. Preferably, layers 47 and 64 are deposited in a low temperature process (e.g., less than approximately 800° C.) to reduce germanium outgassing associated with layer 16 and substrate 14. For example, layer 64 may be deposited using a reactive sputtering or CVD process.

In another alternative embodiment, multiple layers similar to layer 64 can be provided to enhance the sealing effect. Layer 64 can have a thickness of between approximately 50 and 300 Å, and preferably approximately 200 Å.

Figure 7:
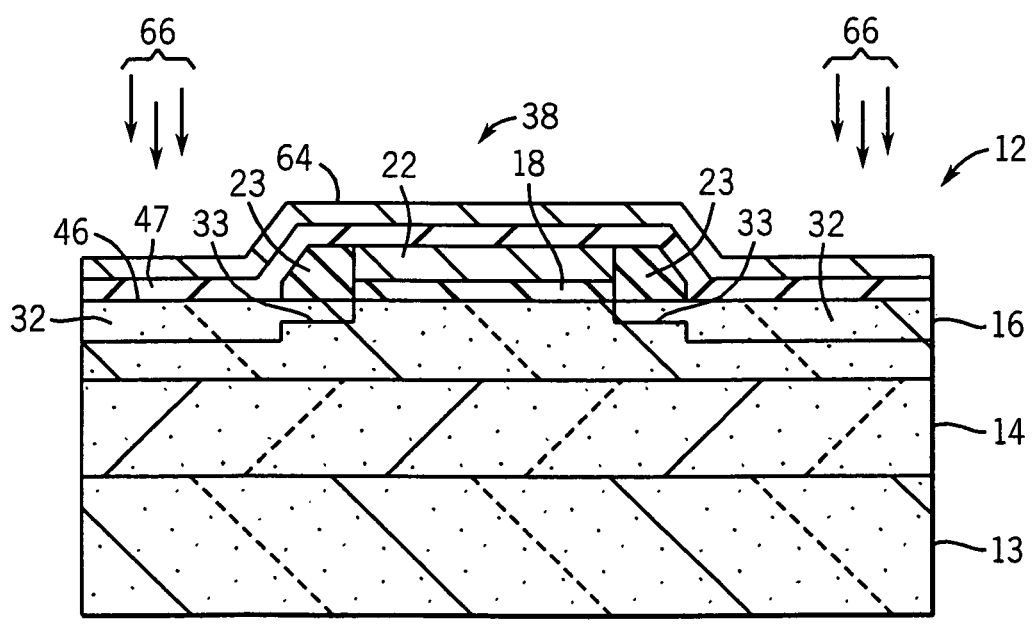
FIG. 7 is a cross-sectional view of the portion illustrated in FIG. 6, showing a doping step.

In FIG. 7, the substrate is doped in accordance with step 58 of process 100. Preferably, non-neutral dopants are implanted into layer 16 or substrate 14 to form source and drain regions 32. Source and drain regions 32 can include source and drain extensions 33 provided underneath spacers 23. Preferably, the non-neutral dopants include at least one of boron difluoride ($BF_2$), boron (B), arsenic (As), and phosphorous (P). Back sputter of germanium due to the implant represented by arrow 66 is reduced via the sealing effect associated with layers 47 and 64.

In accordance with step 60 of process 100, layer 16 is annealed to activate dopants in source and drain regions 32. Preferably, a rapid thermal anneal (RTA) is performed at a temperature above approximately 600° C. According to a preferred embodiment, the RTA is performed at a temperature of approximately 1000° C. for a period of between approximately 5 and 10 seconds. Layers 47 and 64 advantageously prevent germanium outgassing during annealing.

After high temperature processes associated with portion 12 are completed, layers 47 and 64 can be removed from portion 12 and conventional integrated circuit processes can be utilized to complete portion 12. In one embodiment, layers 47 and 64 are removed by dry etching processes. Alternatively, other removal processes can be utilized. In one preferred embodiment, a wet etch process is utilized to remove layer 64 followed by either a wet etch or a dry etch process to remove layer 47.

In one embodiment, portion 12 can be provided above a silicon-on-insulator (SOI) substrate. The stress in the buried oxide layer associated with the silicon-on-insulator substrate can be modified. The modified stress in the buried oxide layer of the silicon-on-insulator substrate modifies the stress associated with the top silicon layer. The stress in the buried oxide layer can be modified by implanting germanium through the top silicon layer into the buried oxide layer. The stress in the top silicon layer caused by the modified stress in the buried oxide layer improves carrier mobility in the top silicon layer, e.g., forms a strained silicon layer.

In another embodiment, portion 12 can be provided on a strained silicon-on-insulator substrate manufactured according to an advantageous process. The advantageous process uses plasma enhanced chemical vapor deposition (PECVD) to deposit a silicon dioxide film with compressive stress on a silicon substrate. A handling wafer or handle wafer is oxidized and bonded to the PECVD film and substrate. The substrate is then removed using a Smart Cut™ process, leaving a thin silicon layer on the PECVD oxide. The silicon layer on the PECVD oxide is in tensile stress, thereby operating as a strained layer.

It is understood that although the detailed drawings, specific examples, and particular values given provide exemplary embodiments of the present invention, the exemplary embodiments are for the purpose of illustration only. The method and apparatus in the aforementioned embodiments are not limited to the precise details and descriptions disclosed. For example, although particular sealing materials are described, other types of sealing materials can be utilized. Various changes may be made to the details disclosed without departing from the scope of the invention which is defined by the following claims.

What is claimed is:

1. A method of manufacturing an integrated circuit having a gate structure above a substrate including germanium, the method comprising:

forming a first layer above the gate structure and above the substrate;

forming a second layer above the first layer; and doping source and drain regions through the first layer and the second layer, whereby germanium back sputtering is reduced.

2. The method of claim 1, further comprising:

annealing the substrate whereby the first layer and the second layer prevent outgassing.

3. The method of claim 1, wherein the first layer includes at least one of silicon dioxide and silicon carbide.

4. The method of claim 1, further comprising:

providing a rapid thermal anneal.

5. A method of manufacturing an integrated circuit having a gate structure above a substrate including germanium, the method comprising:

forming a first layer above the gate structure and above the substrate;

forming a second layer above the first layer; and doping source and drain regions through the first layer and the second layer, whereby germanium back sputtering is reduced;

wherein the second layer includes at least one of silicon nitride, titanium, titanium nitride, titanium/titanium nitride, tantalum nitride, and silicon carbide.

6. A method of manufacturing an integrated circuit having a gate structure above a substrate including germanium, the method comprising:

forming a first layer above the gate structure and above the substrate;

forming a second layer above the first layer; and doping source and drain regions through the first layer and the second layer, whereby germanium back sputtering is reduced;

wherein the steps of forming a first layer and forming a second layer utilize low temperature deposition.

7. The method of claim 6, wherein the low temperature deposition is performed at a temperature below approximately 800° C.

8. The method of claim 6, wherein the low temperature deposition is a chemical vapor deposition process.

9. A method of forming source and drain regions in a strained semiconductor layer, the method comprising:

providing a first layer comprising at least one of silicon nitride and silicon dioxide above the strained semiconductor layer;

providing a second layer above the first layer, the second layer containing nitrogen, titanium, tantalum, or carbon;

implanting non-neutral dopants into the strained semiconductor layer through the first layer and the second layer; and annealing the strained semiconductor layer.

10. The method of claim 9, wherein the annealing step is a rapid thermal anneal for activating the dopants.

11. The method of claim 9, further comprising:

providing an insulative material above the first layer.

12. The method of claim 11, wherein the first layer includes silicon dioxide and the insulative material includes silicon nitride.

13. The method of claim 9, wherein the anneal is a rapid thermal anneal at a temperature above 600° C.

14. A method of forming source and drain regions in a strained semiconductor layer, the method comprising:

providing a first layer comprising at least one of silicon nitride and silicon dioxide above the strained semiconductor layer;

providing a second layer above the first layer, the second layer containing nitrogen, titanium, tantalum, or carbon;

implanting non-neutral dopants into the strained semiconductor layer through the first layer and the second layer;

annealing the strained semiconductor layer, wherein the annealing step is a rapid thermal anneal for activating the dopants; and removing the second layer after the annealing step.

15. A method of forming source and drain regions in a strained semiconductor layer, the method comprising:

providing a first layer comprising at least one of silicon nitride and silicon dioxide above the strained semiconductor layer;

providing a second layer above the first layer, the second layer containing nitrogen, titanium, tantalum, or carbon;

implanting non-neutral dopants into the strained semiconductor layer through the first layer and the second layer; and annealing the strained semiconductor layer, wherein the anneal is a rapid thermal anneal at a temperature above 600° C.;

wherein the first layer is deposited in a low temperature process.

16. The method of claim 15, wherein the second layer containing titanium, nitrogen, tantalum or carbon is provided in a low temperature process.

17. A method of fabricating a transistor in a germanium containing layer, the method comprising:

providing a gate structure above the germanium containing layer;

providing a first layer of insulative material in a low temperature process above the germanium containing layer;

depositing a second layer over the first layer;

doping the germanium containing layer through the first layer to form source and drain regions after depositing the second layer; and annealing the germanium containing layer to activate dopants in the source and drain regions.

18. The method of claim 17, wherein the step of providing a first layer is an LPCVD deposition process performed at a low temperature.

19. The method of claim 18, wherein the step of providing a first layer utilizes an oxygen atmosphere and silane atmosphere.

20. The method of claim 17, wherein the second layer comprises a material selected from the group consisting of nitrogen, titanium, tantalum, and carbon.

* * * * *